United States Patent [19]

Barth et al.

[11] Patent Number: 4,496,875
[45] Date of Patent: Jan. 29, 1985

[54] CONDUCTOR COMPOSITION AND DEVICES USING IT

[75] Inventors: Edward G. Barth, Union; Ruvim Braude, Elizabeth; Nicholas W. Kay, Mine Hill, all of N.J.

[73] Assignee: Burroughs Corporation, Detroit, Mich.

[21] Appl. No.: 506,842

[22] Filed: Jun. 22, 1983

[51] Int. Cl.³ .............................................. H01J 17/00
[52] U.S. Cl. .................................... 313/632; 252/513; 252/512; 106/1.05; 106/1.12; 106/20; 313/517; 313/519; 313/633
[58] Field of Search ....................... 252/512, 513, 519; 106/1.05, 1.12, 20, 290, 308 M, 308 Q, 311, 169, 174, 175, 173 R, 174; 501/73, 77, 79; 313/484, 491, 492, 631, 632, 633, 517, 519, 584, 585

[56] References Cited

U.S. PATENT DOCUMENTS

| | | |
|---|---|---|
| 3,647,532 | 3/1972 | Friedman et al. ................... 252/513 |
| 3,663,241 | 5/1972 | Short .................................... 252/513 |
| 3,868,535 | 2/1975 | Kupsky ............................... 313/519 |
| 4,070,517 | 3/1981 | Kazmierowicz ..................... 252/513 |
| 4,122,232 | 10/1978 | Kuo ..................................... 252/513 |
| 4,255,291 | 3/1981 | Needes et al. .................. 313/633 X |
| 4,433,269 | 2/1984 | Kay ..................................... 252/513 |

Primary Examiner—Josephine L. Barr
Attorney, Agent, or Firm—Kevin R. Peterson; Edmund M. Chung; Robert A. Green

[57] ABSTRACT

A composition for a conductor ink used in a screening process and including a nickel powder, a lead-free glass binder, and a vehicle suitable for firing at a temperature below about 590° C. The conductor composition is designed for use in gas plasma display panels.

4 Claims, 2 Drawing Figures

CONDUCTOR COMPOSITION AND DEVICES USING IT

BACKGROUND OF THE INVENTION

Many types of gas plasma display devices are known which use electrodes formed with a conductor composition deposited on a support plate by a screening process or the like. Cathode glow electrodes and associated conductor runs are formed of such material.

After considerable early experimentation with conductor compositions for use as thick film cathode electrodes, the gas plasma display industry settled on compositions containing nickel as the primary conductive component because of nickel's desirable electrical characteristics and chemical stability. Such compositions, which are usually referred to as pastes or inks, have now been used for many years. In addition to nickel, these inks also contain a glass frit binder, a vehicle, and other constituents, and, when used, the ink is deposited on a soda-lime glass plate or on dielectric layers previously deposited on this plate, and the assembly is then fired. It has been customary to formulate the nickel conductor ink for firing in either air or nitrogen.

The use of compressed air for the furnace atmosphere is desirable because it is relatively low in cost. However, the reactive components required for air firing nickel ink formulations are relatively expensive and cause effects which adversely affect the properties of cathodes and associated conductor elements. Some of these problems can be overcome by using nitrogen firing nickel inks which do not contain these reactive components and firing in a nitrogen atmosphere.

It was recognized early on that the key to optimum performance of nickel inks, with respect to physical and electrical characteristics and processing, is primarily the glass binder system. Since soda-lime float glass is the preferred substrate for these displays, a binder system having a working temperature below 590° C. is necessary to prevent substrate distortion during the conductor firing operation. A wide variety of binders have been tried, and it was found that the most satisfactory compromise was a lead glass. Thus, a binder comprised entirely or in part of a lead glass has been widely used for air or nitrogen firing nickel inks. However, the fundamental problem with a lead glass binder is the relative ease with which reduction to metallic lead can occur, thus degrading the bonds within the nickel conductor and between the nickel conductor and the glass support plate, as well as forming sites for preferential accumulation of mercury which is present in the gas filling of the panel. These defects degrade cathode performance, degrade mechanical properties, and limit the life of the display device.

The present invention provides a new nitrogen firing conductor ink which includes a lead-free glass binder, can be fired in nitrogen, and avoids problems discussed above.

DESCRIPTION OF THE INVENTION

The conductor ink of the invention can be used to form glow cathodes and conductor runs in many different types of display devices including gas plasma display devices of the type known as PANAPLEX panels, bar graphs, SELF-SCAN panels, etc.

Figure 1:
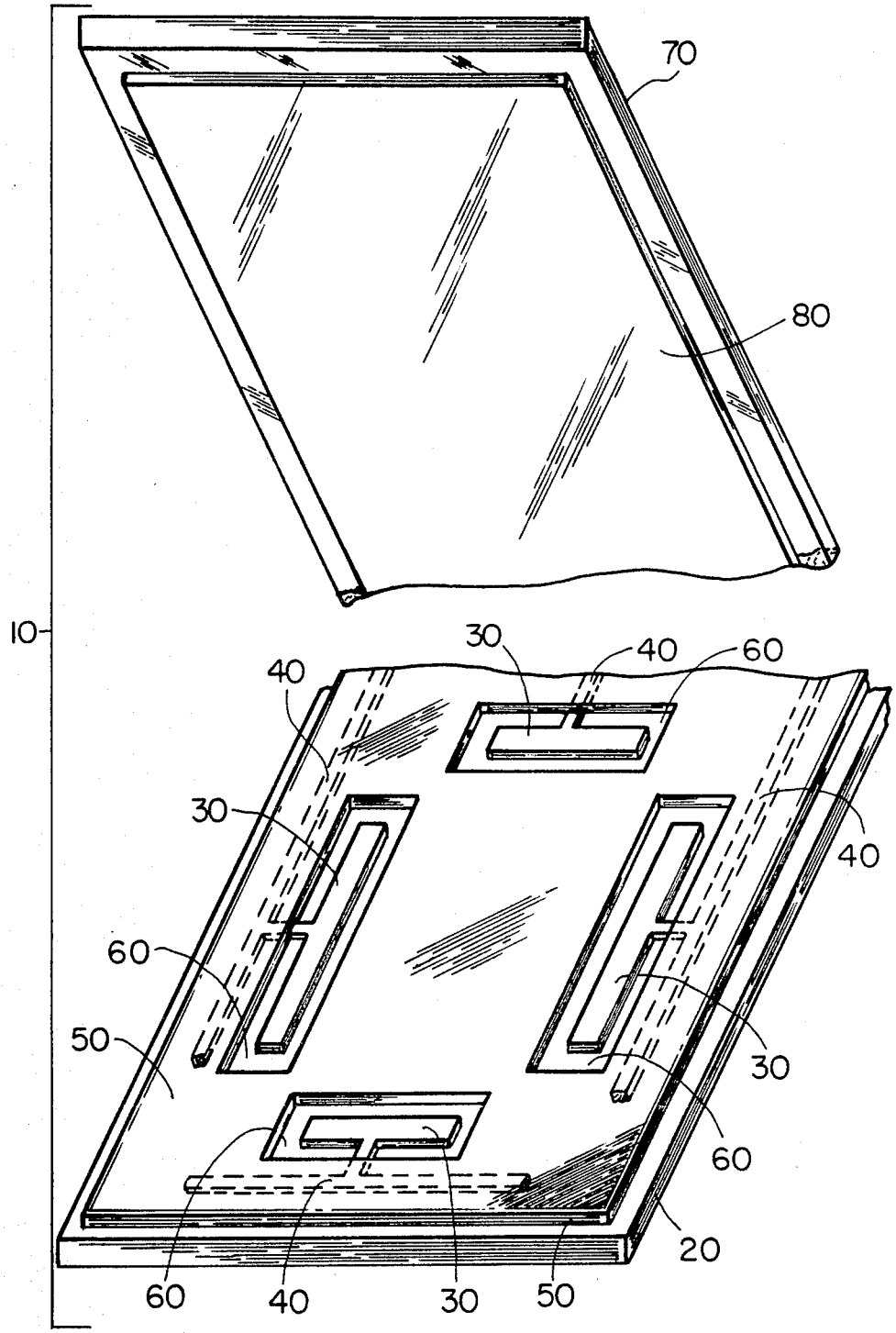
FIG. 1 is a perspective view of a portion of one type of display panel which can use the conductor ink of the invention.

A portion of a segment panel 10 shown in FIG. 1 includes a glass base plate 20, on which a plurality of glow cathode electrodes 30 and their conductor runs 40 are screened using a conductor ink embodying the invention. A layer 50 of dielectric is screened over the cathodes and their runs, with openings 60 provided around the cathodes. The panel face plate 70 carries at least one transparent conductive anode 80 for and overlying the cathodes. Other features included in these panels are not shown in FIG. 1, but are well known to those skilled in the art. Panels of this type are shown in U.S. Pat. No. 3,720,452, dated Mar. 13, 1973, of George A. Kupsky which is incorporated herein by reference.

Figure 2:
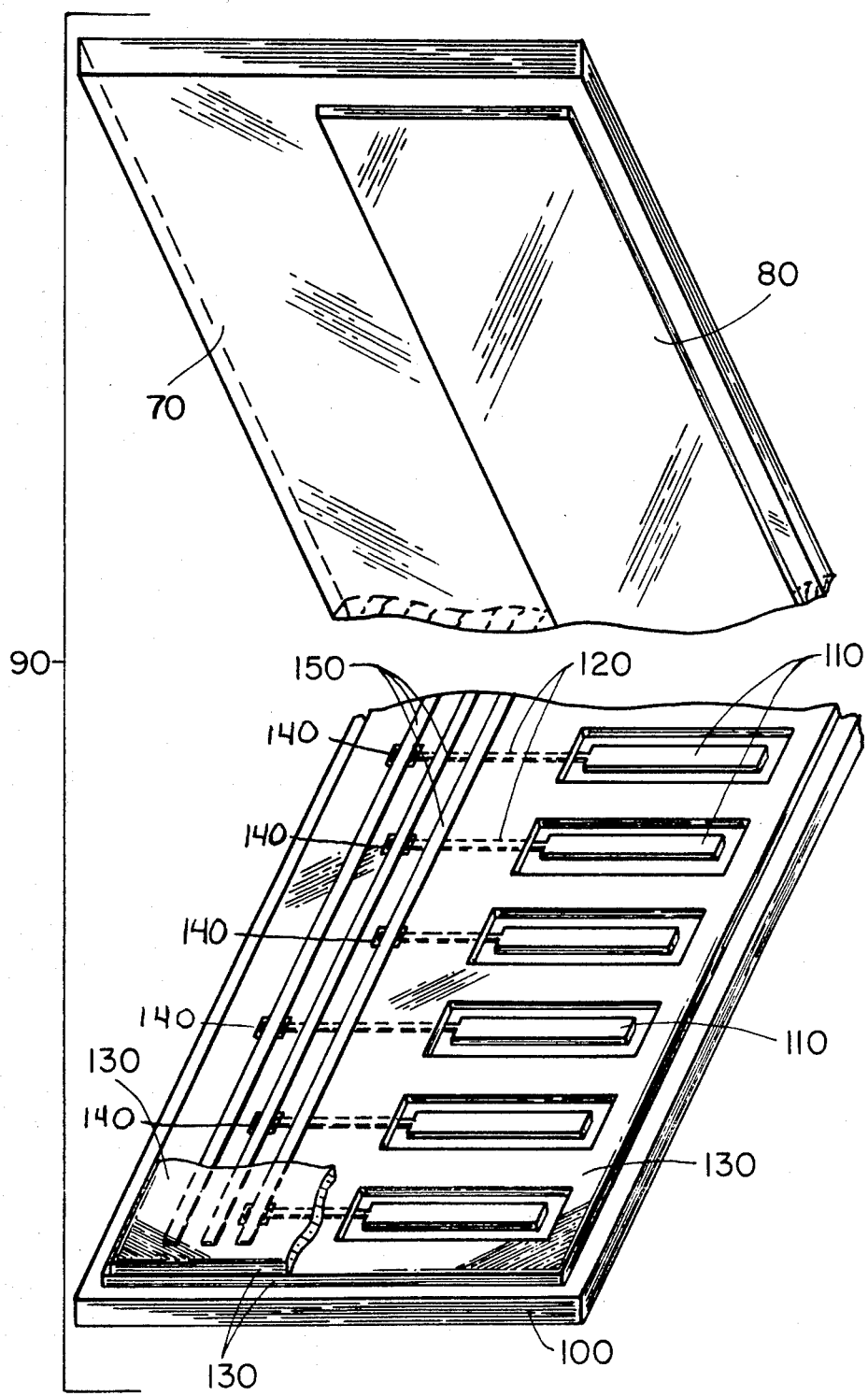
FIG. 2 is a perspective view of a portion of another type of display panel which can use the conductor ink of the invention.

A portion of a bar graph 90 is shown in FIG. 2, and this device includes a glass base plate 100, on which a series of cathode bars 110 are screened along with a plurality of conductor runs 120 extending along the series of cathodes parallel to each other. The cathodes and runs are made with the ink of the invention, and one or more dielectric layers 130 are provided on the base plate outlining the cathodes and having vias 140 over the conductor runs, with conductors 150 connecting selected cathodes through the vias to the same conductor run so that the cathodes are connected in groups. One or more of the dielectric layers 130 cover these connecting conductors and also outline the cathode elements. The bar graph includes a face plate and suitable transparent anode, as shown in FIG. 1. Bar graphs are shown in U.S. Pat. No. 3,973,166, dated Aug. 3, 1976, of Thomas C. Maloney which is incorporated herein by reference.

The ink of the invention contains the constituents which are listed below in weight percents:

| | Component | Fraction Composition | Optimum Ink Composition |
|---|---|---|---|
| Inorganic Fraction | Nickel Powder | 86.4 | 76.0 |
| | Glass Frit | 13.6 | 12.0 |
| | | 100.0 | |
| Vehicle Fraction | Ethyl Cellulose | 6.7 | 0.8 |
| | Texanol | 28.3 | 3.4 |
| | Alpha Terpineol | 40.0 | 4.8 |
| | 2-(2-Methoxyethoxy) ethanol | 25.0 | 3.0 |
| | | 100.0 | 100.0 |

This ink has been found to be optimum for many types of display panels. However, it will be clear to those skilled in the art that modifications in substances and their percentages may be made for various specific uses. The glass frit described below should be utilized in any case to achieve optimum results.

In the above composition, the nickel is a spherical powder of minus 500 mesh particle size.

With respect to the inorganic fraction, the proportion 86.4% of nickel to 13.6% glass frit within the inorganic fraction has been found to be optimum; however, a range of about 70–95% nickel to 5–30% glass was also usable and may be more desirable in certain applications. Wide variations in both the proportion of inorganic to vehicle fractions and vehicle formulation can be used to optimize the final ink composition for an intended application.

The glass frit is prepared from the lead-free glass described and claimed in an application, Ser. No. 506,841 entitled "Glass Composition and Gas-Filled Display Panel Incorporating the Glass" filed concurrently herewith by Ruvim Braude. This lead-free glass has a thermal coefficient of expansion which closely matches that of soda-lime glass. In addition, the glass can withstand sealing temperatures up to 490° C. without significant softening and can be fired below 600° C. to prevent distortion of the soda-lime base plate.

The glass includes:

| Component | Weight Percent | |
|---|---|---|
| | Optimum | Usable Range Variation |
| $SiO_2$ | 20 | ±6 |
| ZnO | 40 | ±6 |
| $B_2O_3$ | 20 | ±5 |
| $Al_2O_3$ | 5 | 1–6 |
| $Na_2O$ | 7 | 2–10 |
| $K_2O$ | 4 | 0–6 |
| CaO | 3 | 1–5 |
| $Li_2O$ | 1 | 0–2 |

In preparing the glass, the various components are melted in a platinum crucible furnace at a temperature of about 1100° C. and maintained at that temperature for approximately four hours. Conventional grinding is used to reduce the glass to a frit having an average particle size of about five microns.

In the above composition, the nickel is a spherical powder of minus 500 mesh particle size which provides optimum printing and minimum surface oxidation characteristics.

For fabricating the cathodes in the devices shown, the conductor ink is applied by thick film screen printing, doctor blading, or by any other suitable method. The ink is prepared by blending the finely ground glass and the other components by milling, mixing, and three-roll-mill blending. These operations are not critical and may be carried out in any suitable manner.

After the cathodes are screened, they are fired in a conventional nitrogen atmosphere in a thick film belt furnace set to provide a peak temperature of about 585° C. for fifteen minutes. Other operations can be performed as required, and the other parts of a display panel can be assembled with the cathode assembly.

The ink of the invention has been found to have the following advantages over the prior art:
1. Since it can be fired in nitrogen, it has all of the advantages which firing in nitrogen imparts.
2. Since the glass binder has no lead, it is not reduced, and the composition can be fired in conventional nitrogen or, preferably, in a sequential air, nitrogen/hydrogen cycle to insure complete organic removal and minimal nickel oxide formation.
3. Cathodes produced from this composition have uniform surface characteristics, without carbon inclusions, without excessive oxides on the nickel particles, and without active sites for preferential mercury buildup, thus permitting minimum aging times, wide operating range characteristics, and significantly extended operating service life.
4. Fine line, high resolution conductors can be formed primarily because of the spherical nickel powder and with the proper vehicle system such as that described. As an example, five mil lines and spaces can be readily formed.

What is claimed is:
1. A conductor ink for forming thick film conductors on a soda lime substrate fireable at temperatures below 590° C. and comprising nickel powder, a lead-free glass frit binder and a vehicle,
    said nickel powder having a spherical structure and the glass frit in said binder having a composition comprising about 20% by weight of $SiO_2$, about 20% by weight of $B_2O_3$, about 3% by weight of CaO, about 40% by weight of ZnO, about 5% by weight of $Al_2O_3$, about 7% by weight of $Na_2O$, about 4% by weight of $K_2O$, and about 1% by weight of $Li_2O$,
    the nickel powder being present in about 76 weight percent and the glass frit binder being present in about 12 weight percent, with the remainder being the vehicle.
2. The conductor ink defined in claim 1 wherein said vehicle comprises ethyl cellulose, texanol, alpha terpineol, and 2-(2 methoxy-ethoxy) ethanol.
3. A gas plasma display panel including
    an envelope made up of a base plate of soda lime glass and a face plate and containing an ionizable gas,
    a plurality of thick film cathode electrodes in said envelope, said cathode electrodes being formed on said base plate from an ink composition including nickel and a lead-free glass frit binder, and
    at least one anode electrode in operative relation with said cathode electrodes,
    in said ink composition:
    said nickel powder having a spherical structure and about minus 500 mesh particle size,
    the glass frit in said binder having a composition comprising about 20% by weight of $SiO_2$, about 20% by weight of $B_2O_3$, about 3% by weight of CaO, about 40% by weight of ZnO, about 5% by weight of $Al_2O_3$, about 7% by weight of $Na_2O$, about 4% by weight of $K_2O$, and about 1% by weight of $Li_2O$,
    the nickel powder being present in about 76% by weight and the glass frit binder being present in about 12% by weight, with the remainder being a vehicle.
4. The panel defined in claim 3 wherein in the ink formulation said vehicle comprises ethyl cellulose, texanol, alpha terpineol and 2-(2-methoxyethoxy) ethanol.

* * * * *